(12) United States Patent
Kim et al.

(10) Patent No.: US 7,746,688 B2
(45) Date of Patent: Jun. 29, 2010

(54) PRAM AND METHOD OF FIRING MEMORY CELLS

(75) Inventors: Hye-jin Kim, Gangnam-gu (KR); Kwang-jin Lee, Hwaseong-si (KR); Du-eung Kim, Yongin-si (KR); Woo-yeong Cho, Suwon-si (KR); Chang-han Choi, Suwon-si (KR); Ki-won Lim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 225 days.

(21) Appl. No.: 11/933,536

(22) Filed: Nov. 1, 2007

(65) Prior Publication Data
US 2008/0106930 A1  May 8, 2008

(30) Foreign Application Priority Data
Nov. 8, 2006  (KR) ............... 10-2006-0110059

(51) Int. Cl.
*G11C 11/00* (2006.01)
(52) U.S. Cl. ............... 365/163; 365/148; 365/201
(58) Field of Classification Search .......... 365/163, 365/148, 201
See application file for complete search history.

(56) References Cited

U.S. PATENT DOCUMENTS

| 5,912,839 | A | 6/1999 | Ovshinsky et al. |
| 6,075,719 | A | 6/2000 | Lowrey et al. |
| 2005/0052904 | A1* | 3/2005 | Cho et al. ............... 365/163 |
| 2006/0181922 | A1 | 8/2006 | Dodge et al. |
| 2006/0197115 | A1* | 9/2006 | Toda ............... 257/248 |

FOREIGN PATENT DOCUMENTS

| KR | 1020040014198 A | 2/2004 |
| KR | 1020040096587 A | 11/2004 |
| KR | 1020050025730 A | 3/2005 |
| KR | 1020050030294 A | 3/2005 |
| KR | 1020060016312 A | 2/2006 |
| KR | 1020060045790 A | 5/2006 |

* cited by examiner

*Primary Examiner*—Huan Hoang
(74) *Attorney, Agent, or Firm*—Volentine & Whitt, PLLC

(57) ABSTRACT

A PRAM includes a memory cell array of phase change memory cells, and a write circuit receiving an externally provided first voltage and supplying a write pulse for writing data to the memory cells in a normal operation mode. The write circuit also receives an externally provided second voltage higher than the first voltage and supplies a firing pulse to at least one firing-failed phase change memory cell.

24 Claims, 14 Drawing Sheets

US 7,746,688 B2

PRAM AND METHOD OF FIRING MEMORY CELLS

CROSS REFERENCE TO RELATED APPLICATION

This application claims priority to Korean Patent Application No. 10-2006-0110059 filed on Nov. 8, 2006, the subject matter of which is hereby incorporated by reference.

BACKGROUND OF THE INVENTION

1. Field of the Invention

The present invention relates to a PRAM and a method of firing memory cells in same.

2. Description of the Related Art

A Phase change Random Access Memory (PRAM) stores data using a phase change material, such as a chalcogenide alloy. The logic state of the stored data is determined by the physical state of the phase change material (e.g., a crystalline state verses an amorphous state). Contemporary phase change materials alter their physical state under defined thermal conditions (e.g., applied heating and cooling conditions). One common form of phase change material exhibits low electrical resistance in a crystalline state and a high resistance in an amorphous state. The crystalline state has been associated with a "set" logic value (i.e., a logic value of 0). The amorphous state has been associated with a "reset" value (i.e., a logic value of 1).

The fabrication of a PRAM, like all other semiconductor memory devices involves the complex sequence of fabrication processes. However, unique to the fabrication of PRAM devices, is the process of "firing". The firing process applies one or more electrical pulses of relatively significantly magnitude to a phase change memory cell. More specifically, following the fabrication of the phase change memory cell, the constituent phase change material resides in a mixed amorphous state, including material in a Face-Centered-Cubic (FCC) state, and other material in an Hexagonally-Close-Packed (HCP) state. A principal object of the firing process is to place all of the phase change material uniformly in the FCC state. Once the phase change material is placed in the FCC state, transition characteristics associated with the material may be readily predicted (i.e., conditions associated with changing the material between an amorphous state and a crystalline state may be predicted with good accuracy). This predictability allows for improved sensing margins for the constituent phase change memory cell.

The foregoing assumes that that the "firing pulse" applied during the firing process are of a sufficient magnitude to uniformly change the initial state of the phase change material. For this assumption to hold, a firing pulse of significant magnitude must be applied. However, application of a large magnitude firing pulse runs the risk of damaging one or more of the weaker phase change memory cells in a memory cell array.

Additionally, conventional PRAMs include a circuit block specifically designed to facilitate the firing process. This requirement expands the size of conventional PRAMs in direct opposition to considerable ongoing efforts to minimize its size.

SUMMARY OF THE INVENTION

Embodiments of the invention provide a phase change random access memory (PRAM) and related method capable of performing a stable firing process (or performing a stable firing operation).

In one embodiment, the invention provides a PRAM comprising; a memory cell array having a plurality of phase change memory cells, and a write circuit receiving an externally supplied first voltage and supplying a write pulse for writing data to the plurality of phase change memory cells in a normal mode, and receiving an externally provided second voltage higher than the first voltage and supplying a firing pulse for firing the plurality of phase change memory cells in a test mode.

In another embodiment, the invention provides a method of firing a PRAM, the method comprising; preparing a PRAM including a plurality of phase change memory cells, and a write circuit supplying a write pulse for writing data to the plurality of phase change memory cells in a normal mode and supplying a firing pulse associated with a firing operation to the plurality of phase change memory cells in a test mode, causing the PRAM to enter the test mode, and receiving an externally provided second voltage, higher than a first voltage applied during the normal mode, and supplying the firing pulse to the plurality of phase change memory cells.

In another embodiment, the invention provides a method of firing a PRAM, the method comprising; preparing a PRAM including a plurality of phase change memory cells, performing a verifying read on data stored in the plurality of phase change memory cells, determining whether the verified data is in a specific state, and identifying at least one firing-failed phase change memory cell having verified and read data not in the specific state, and firing the at least one firing-failed phase change memory cell to the specific state.

BRIEF DESCRIPTION OF THE DRAWINGS

Embodiments of the invention will be described with reference to the attached drawings in which.

DESCRIPTION OF EMBODIMENTS

Figure 1:
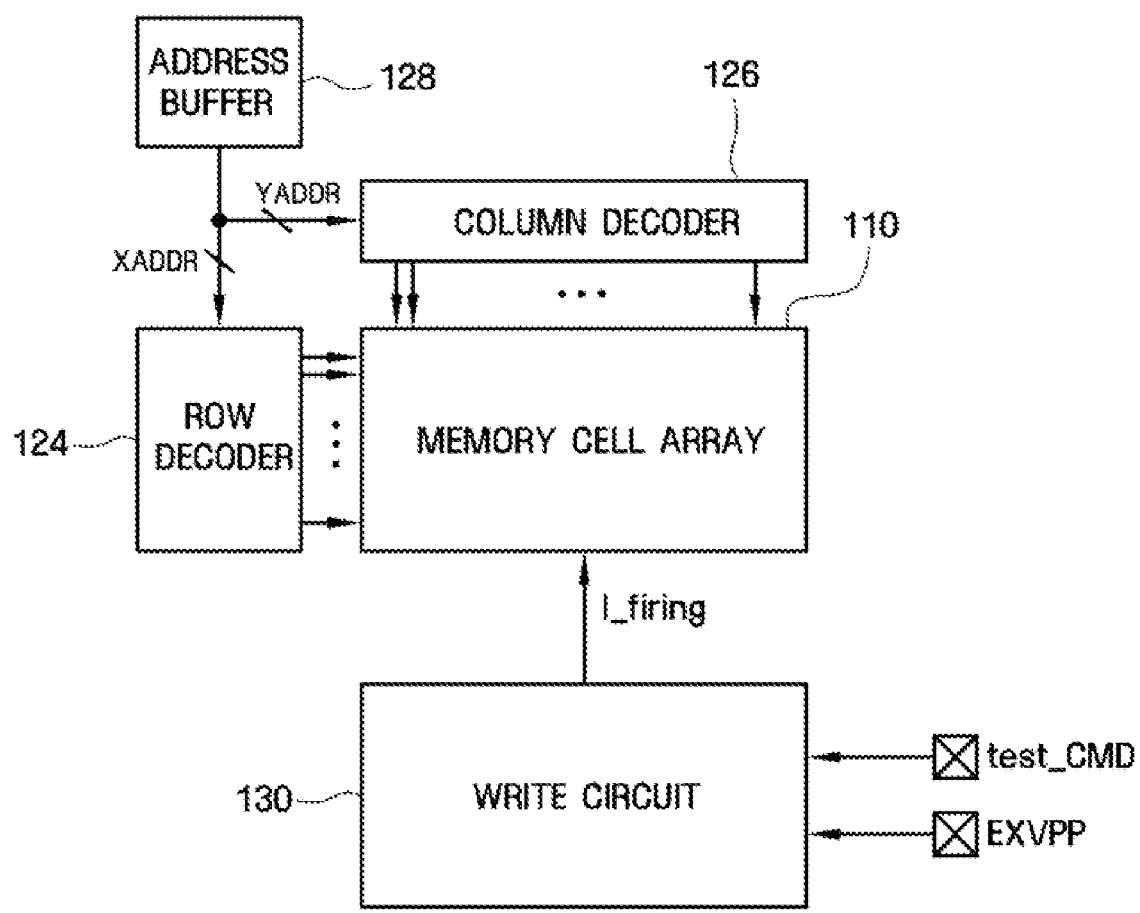
FIG. 1 is a conceptual block diagram illustrating a PRAM according to an embodiment of the invention.

Advantages and features of the present invention and methods of accomplishing the same may be understood more readily by reference to the following description of embodiments with reference to the accompanying drawings. The present invention may, however, be embodied in many different forms and should not be construed as being limited to only the illustrated embodiments. Rather, these embodiments are provided as teaching examples. Throughout the drawings and written description like reference numerals denote like or similar elements.

FIG. 1 is a conceptual block diagram illustrating a phase change random access memory (PRAM) according to an embodiment of the invention.

Referring to FIG. 1, a PRAM according to an embodiment of the invention generally includes a memory cell array 110, a row decoder 124, a column decoder 126, an address buffer 128, and a write circuit 130.

The memory cell array 110 includes a plurality of phase change memory cells. Though not shown, each of the phase change memory cells includes a variable resistive element that has a phase change material having two resistance values according to a crystal state or an amorphous state, and an access element that controls a current flowing in the variable resistive element. Here, the access element may be a diode or a transistor that is connected to the variable resistive element in series. Further, as the phase change material, various materials, such as GaSb, InSb, InSe, Sb2Te3, and GeTe containing two atoms, GeSbTe, GaSeTe, InSbTe, SnSb2Te4, and InSbGe containing three atoms, and AgInSbTe, (GeSn)SbTe, GeSb(SeTe), Te81Ge15Sb2S2 containing four atoms may be used. In the illustrated embodiment of the invention, GeSbTe containing germanium (Ge), antimony (Sb), tellurium (Te) is assumed.

The row decoder 124 receives a row address XADDR from the address buffer 128, decodes the row address XADDR, and assigns a row of a plurality of phase change memory cells to be written. The column decoder 126 receives a column address YADDR from the address buffer 128, decodes the column address YADDR, and assigns a column of a plurality of phase change memory cells to be written.

In the illustrated example of FIG. 1, the write circuit 130 performs a write operation in a normal mode and performs a firing operation in a test mode. Specifically, in the normal mode, the write circuit 130 receives an externally supplied first voltage (e.g., a power supply voltage) and supplies a write pulse suitable for writing write data to plurality of phase change memory cells. Further, in the test mode, the write circuit 130 receives a second voltage (e.g., an external supplied elevated voltage EXVPP) higher than the first voltage and supplies a firing pulse "I_firing" firing the plurality of phase change memory cells. Thus, embodiments of the invention do not require a specially provided and additional circuit block for performing the firing operation. Instead, write circuit 130 may be used for a duel purposes—performing write operations and performing the firing operation.

Further, in the test mode, write circuit 130 may optionally perform a firing verification operation similar to a write verification operation. The firing verification operation is able to identify any phase change memory cell(s) that have failed due to the firing operation (hereafter, "firing-failed memory cells"). Such firing-failed memory cells may be subjected to an additional firing pulse to properly condition the constituent phase change material.

In certain embodiments of the invention, the firing pulse may be applied as a "firing set pulse" placing the plurality of phase change memory cells into the set state, and/or a "firing reset pulse" placing the plurality of phase change memory cells into the reset state.

In a PRAM according to an embodiment of the invention capable of performing a firing verification operation, the firing pulse may be applied at a relatively smaller magnitude, such that the potential for damage to weaker phase change memory cells is reduced.

PRAMs designed according to an embodiment of the invention may be operated in normal mode using a so-called division write method. The division write method may be summarized as follows.

Write data input simultaneously through a plurality of input/output (I/O) pins (e.g., 16 I/O pins) cannot be written simultaneously in a corresponding plurality of phase change memory cells. For example, if the electrical current required to write a reset value to a phase change memory cell is 1 mA, it would require 16 mA to write data to 16 phase change memory cells simultaneously. Assuming a typical write driver efficiency for a reset pulse of around 10%, a peak current supply capacity of 160 mA is required. Such a requirement is clearly incompatible with practical PRAM implementations.

Thus, in view of the practical limitations on the current driving capability within contemporary PRAMs, the division write operation is used and proceeds on the basis of a "cell group" including at least one phase change memory cell. Continuing with the working assumptions stated above, in a ×2 division write mode, 16 phase change memory cells are divided into eight (8) cell groups of two cells each, and the write operation is performed sequentially during eight separate division write sessions.

In a PRAM according to an embodiment of the invention, even though write data may be written in a ×2 division write mode during normal mode, firing can nonetheless be performed in a ×16 division write mode during the test mode. This is, because the second voltage may be externally supplied to the PRAM, the practical limitations associated with the internal current driving capacity of the PRAM may be ignored.

Thus, where it is assumed that the write circuit simultaneously supplies a write pulse to "N" (where N is a natural number) phase change memory cells among the plurality of phase change memory cells during a normal mode, and also simultaneously supplies a firing pulse to "M" (where M is a natural number) phase change memory cells among the plurality of phase change memory cells during a test mode, M will be greater than or equal to N.

With reference to the illustrated embodiment of FIG. 1, it is assumed that the PRAM enters a test mode upon receiving an externally supplied test command "test_CMD" applied to the write circuit 130. However, other test mode indication techniques may be used, such as tripping a fuse or the like.

Hereinafter, an example of a PRAM entering a test mode will be described with reference to FIG. 2. Further, various examples of applying a firing pulse following a firing verification operation consistent with embodiments of the invention will be specifically described with reference to FIGS. 3A to 9B. In addition, various configurations for a PRAM according to embodiments of the invention will be described with reference to FIG. 10 to FIG. 13.

Figure 2:
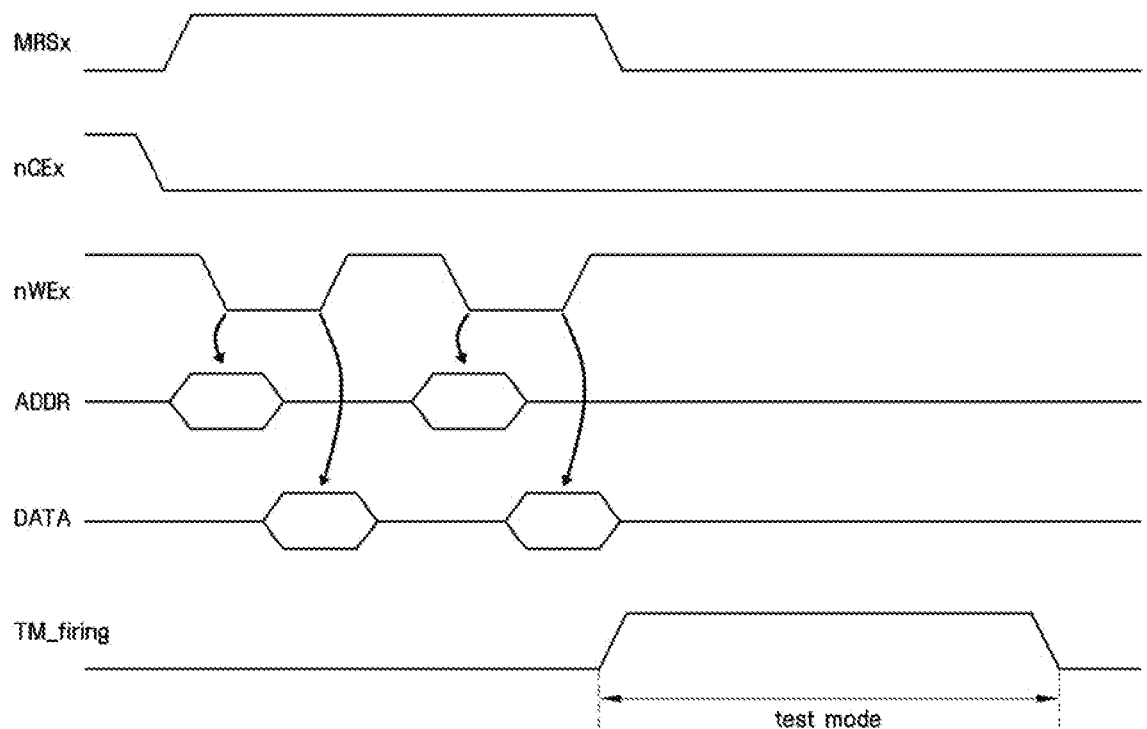
FIG. 2 is a timing chart illustrating a case where a PRAM according to an embodiment of the invention enters a test mode.

FIG. 2 is a timing chart illustrating one exemplary case where a PRAM according to an embodiment of the invention enters a test mode. Here, as an exemplary method of entering the test mode, a mode register set signal is used to program a NOR flash device. However, the scope of the invention is not limited to only this approach. For example, where the interface for the PRAM changes, the method of entering the test mode may change accordingly.

Referring to FIG. 2, an MRSx signal represents a mode register set signal, a CEx signal represents a chip enable signal, and a WEx signal represents a write enable signal. Further, ADDR represents an address, DATA represents data, and TM_firing represents a firing enable signal. In one embodiment, the test command test_CMD of FIG. 1 may be implemented as a combination of logic values provided by the mode register set signal MRSX, the address ADDR, and data DATA.

For example, after the mode register set signal MRSx goes high, the address ADDR and data DATA are input for two clock cycles. At this time, according to input data DATA, the PRAM enters the test mode and may perform a firing operation. Accordingly, the firing enable signal TM_firing goes high.

Figure 3A:
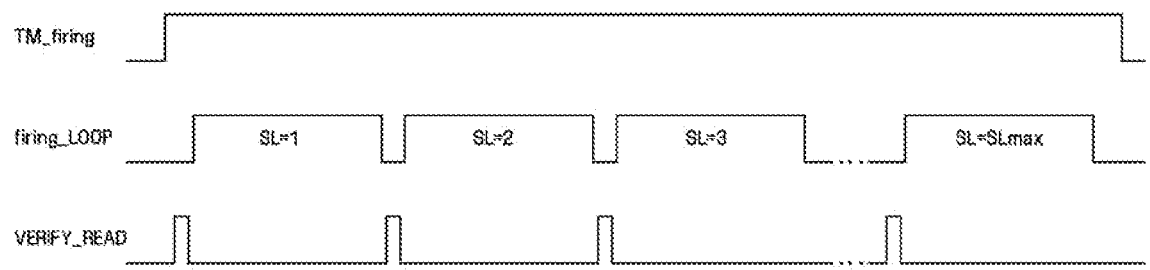
FIG. 3A is a conceptual timing chart illustrating a method of firing a PRAM according to an embodiment of the invention.
Figure 3B:
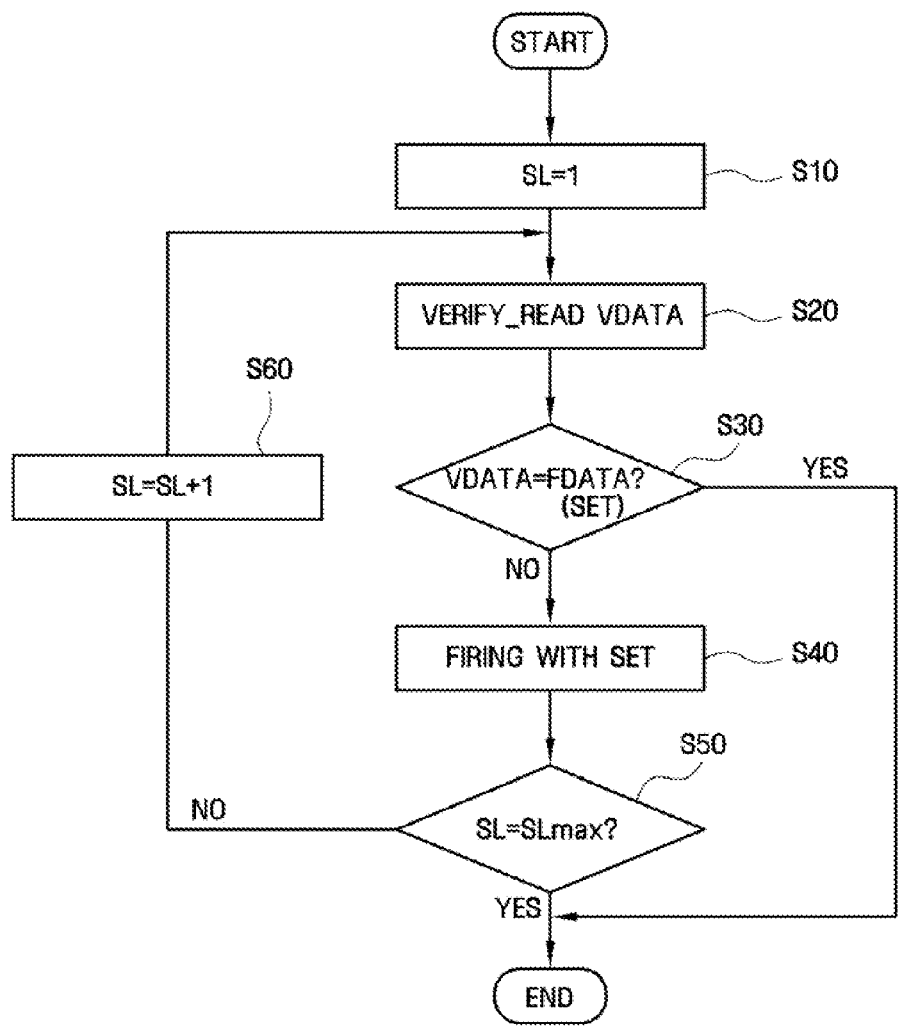
FIG. 3B is an exemplary flowchart for executing the timing chart of FIG. 3A.
Figure 4:
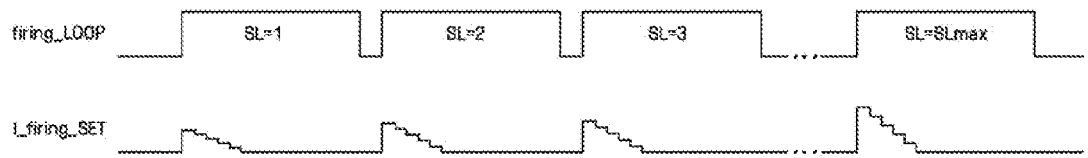
FIGS. 4, 5A, 5B and 5C are diagrams illustrating the form of a firing set pulse that is used in a PRAM according to an embodiment of the invention.
Figure 5A:
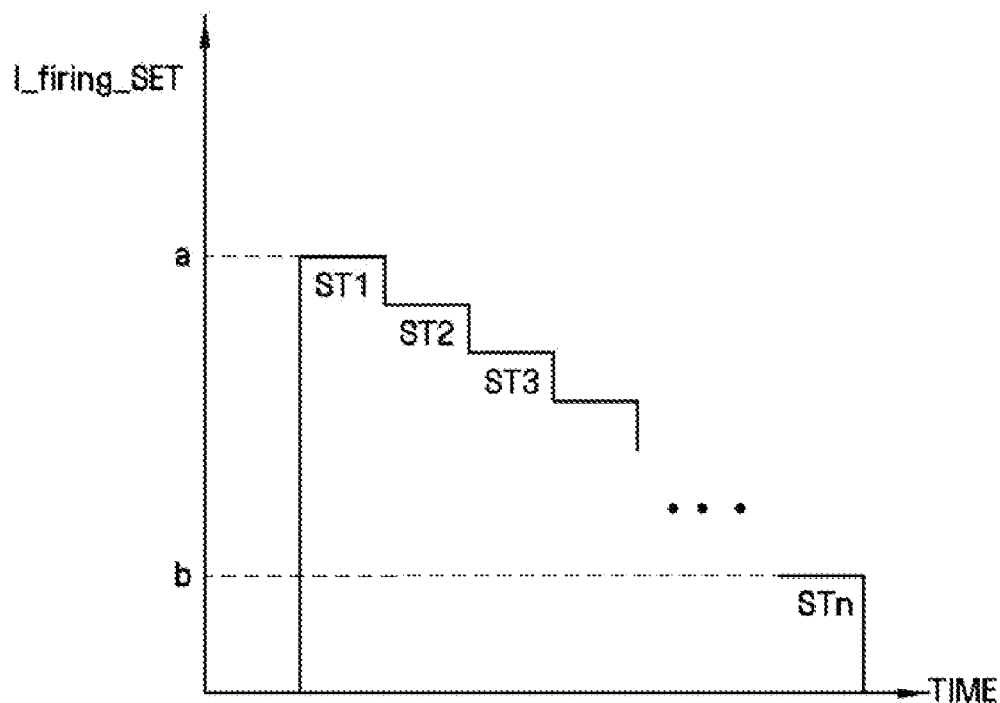
Figure 5B:
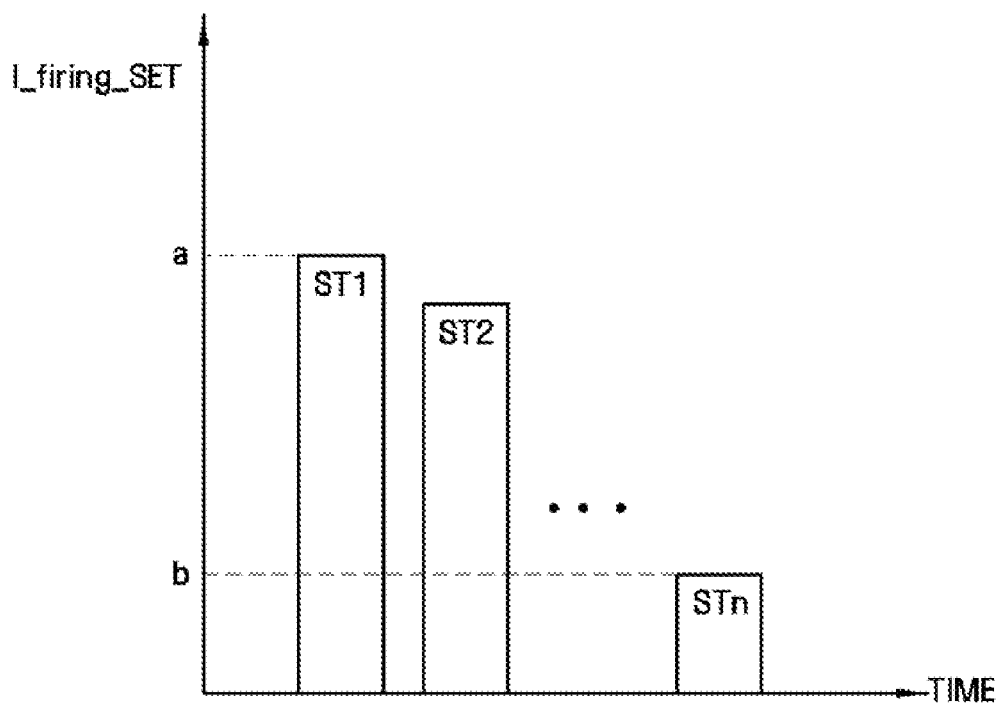

FIG. 3A is a conceptual timing chart illustrating a firing operation for an exemplary PRAM according to an embodiment of the invention. FIG. 3B is a corresponding flowchart to the timing chart of FIG. 3A. FIGS. 3A and 3B more specifically illustrate one example of a plurality of phase change memory cells being fired using a set state. FIGS. 4, 5A, and 5B are related waveform diagrams illustrating the form of a possible firing set pulses used by a PRAM according to an embodiment of the invention.

First, referring to FIG. 3A, in a PRAM according to an embodiment of the invention, a firing operation is performed using a plurality of firing loops SL=1 to SLmax. Before each of the firing loops, a verify read operation VERIFY_READ is performed. Then, in each of the firing loops, any firing-failed phase change memory cells having verification data that differs from corresponding firing data are identified. Identified firing-failed phase change memory cells are then fired using a set state. In this context, verification data is data actually stored in the phase change memory cells to be fired (said stored data indicating a physical state for the phase change material). In contrast, firing data is the data intended to be stored in the plurality of phase change memory cells during the firing operation.

Figure 5C:
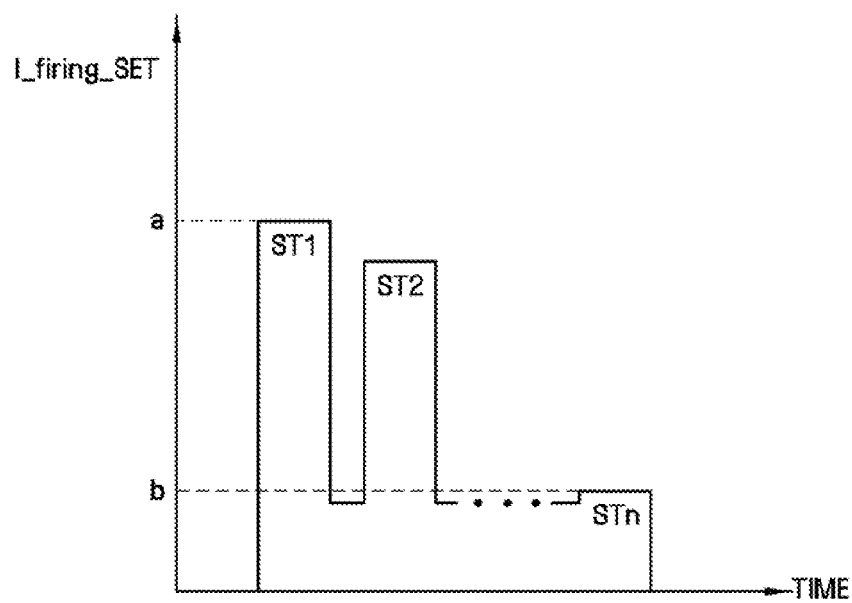

As further indicated in FIG. 4, in each of the firing loops, a firing set pulse I_firing_SET is supplied to the firing-failed phase change memory cells to fire them to the set state. Various forms of the firing set pulse I_firing_SET may be used. For example, as shown in FIGS. 4 and 5A, the firing set pulse I_firing_SET may have a waveform characterized by sequentially descending steps over time from a predetermined current level. Further, as shown in FIGS. 5A, 5B and FIG. 5C, the descending steps waveform may be applied as a continuous waveform (FIG. 5A), a sequence of sequentially reduced return-to-zero impulses (FIG. 5B), or a sequence of sequentially reduced non-return-to-zero impulses (FIG. 5C). The example shown in FIG. 5C shows a case where the prescribed lower current level for the non-return-to-zero waveform is set to a defined minimum current associated with the last sequential impulse. These examples are merely illustrative of many other possibilities. For example, the firing set pulse I_firing_SET may be implemented as a sequence of sequentially increasing impulses followed by another sequence of sequentially decreasing impulses.

The maximum current level for the firing set pulse I_firing_SET associated with each firing loop may vary. For example, as shown in FIG. 4, the maximum firing set pulse I_firing_SET, as applied in a sequence of sequentially descending impulses may be increased over time with each successive loop increment. However, other approaches to the application of loop specific maximum current levels may be taken (e.g., a constant maximum current level).

Referring to FIGS. 3A and 3B, an initial firing loop increment counter SL is set to "1" (S10). A verify read operation is then performed for a defined plurality of phase change memory cells (S20). Verification data VDATA obtained from the verify read operation is then compared with firing data FDATA (S30). Here, it is assumed that the firing data FDATA indicates a set state for each phase change memory cell.

Memory cells showing verification data VDATA equal to the expected firing data FDATA (S30=yes), are determined to be properly fired, and the firing operation is terminated. However, memory cells showing verification data VDATA not equal to the expected firing data FDATA (S30=no), are determined to be improperly fired, and the firing operation continues by again firing the firing failed phase change memory cells to a set state (S40). Afterwards, if the firing loop SL has not reached its maximum defined value SLmax (S50), it is incremented (S60) and the operation returns to the verify read step (S20). Otherwise, the firing operation terminates.

Thus, the firing operation will continue until all phase change memory cells exhibit properly fired data characteristics, or the maximum number of firing operation retries are applied to the firing-failed phase change memory cells.

The foregoing exemplary method may optionally include, before performing the verify read (S20), a writing data operation for the plurality of phase change memory cells establishing a set state.

Figure 6A:
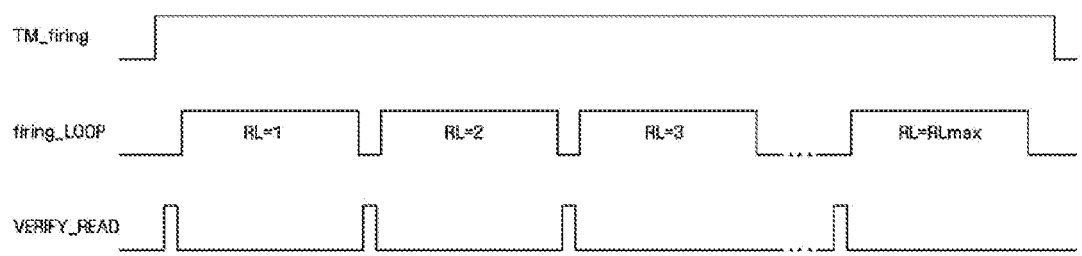
FIG. 6A is a conceptual timing chart illustrating a method of firing a PRAM according to another embodiment of the invention.
Figure 6B:
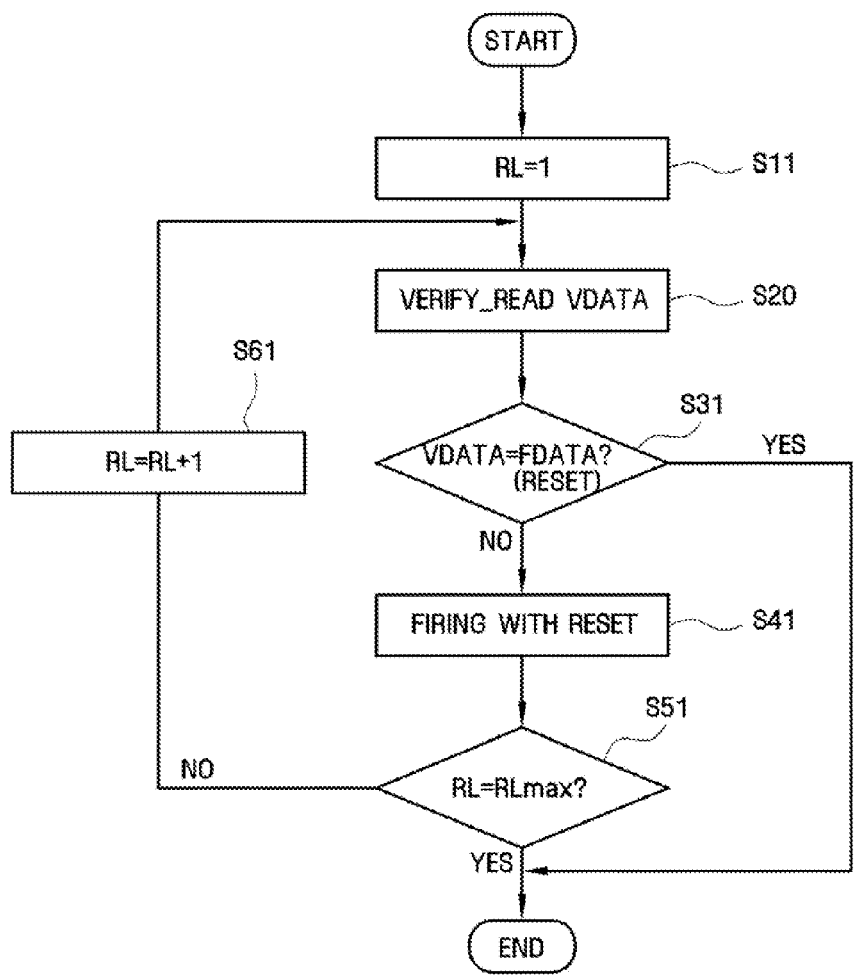
FIG. 6B is an exemplary flowchart for executing the timing chart of FIG. 6A.
Figure 7:
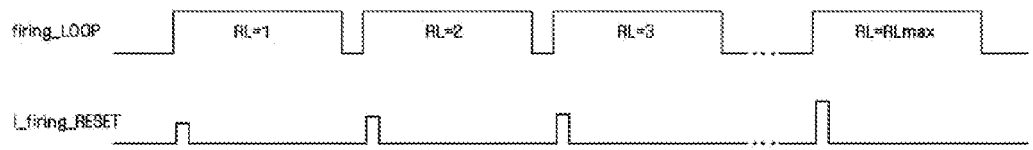
FIG. 7 is a diagram illustrating the form of a firing reset pulse that is used in a PRAM according to an embodiment of the invention.

FIG. 6A is a conceptual timing diagram illustrating a method of firing a PRAM according to another embodiment of the invention. FIG. 6B is a flowchart related to the timing diagram of FIG. 6A. FIGS. 6A and 6B specifically illustrate a case where a plurality of phase change memory cells are fired to a reset state in stead of a set state as previously described. FIG. 7 is a diagram illustrating the form of a firing reset pulse that may be used in relation to the exemplary PRAM according to an embodiment of the invention.

First, referring to FIG. 6A, the PRAM according to an embodiment of the invention again performs firing through a plurality of firing loops RL=1 to RLmax. Specifically, before each of the firing loops, a verify read operation VERIFY_READ is performed. Then, in each of the firing loops RL=1 to RLmax, any firing-failed phase change memory cells identified by the verification data are fired to the reset state.

The current level of the firing reset pulse I_firing_RESET to be used in each of the firing loops RL=1 to RLmax may vary. The firing reset pulse I_firing_RESET has the predetermined current level which may increase as the firing loop firing_Loop increases as shown in FIG. 7. However, the scope of the invention is not limited thereto. For example, as the firing loop firing_LOOP increases, the predetermined current level may be constant.

Comparing FIGS. 6A and 6B to FIGS. 3A and 3B, this additional embodiment proceeds as previously described by using the exemplary signal waveforms.

Figure 8A:
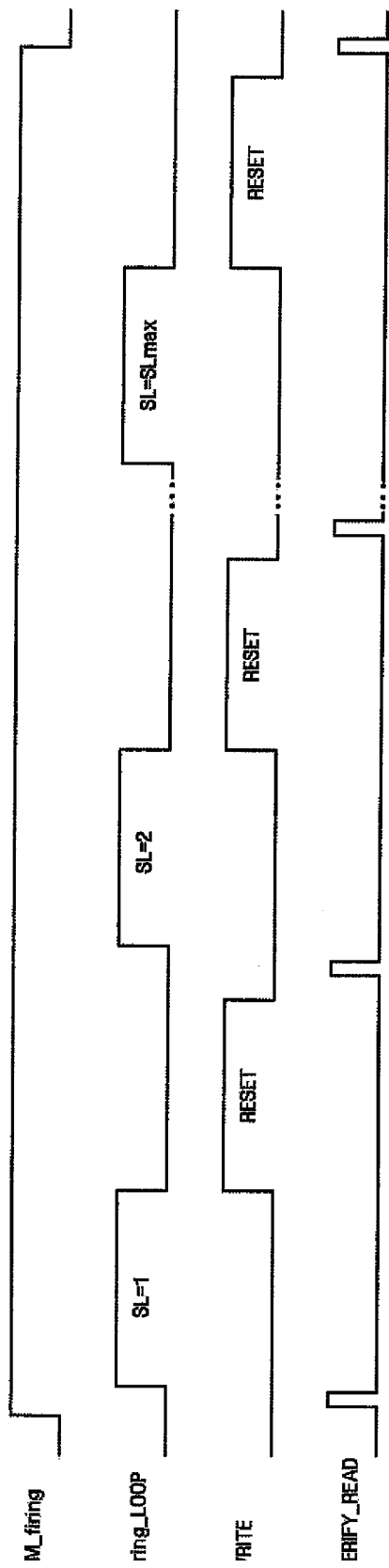
FIG. 8A is a conceptual timing chart illustrating a method of firing a PRAM according to still another embodiment of the invention.
Figure 8B:
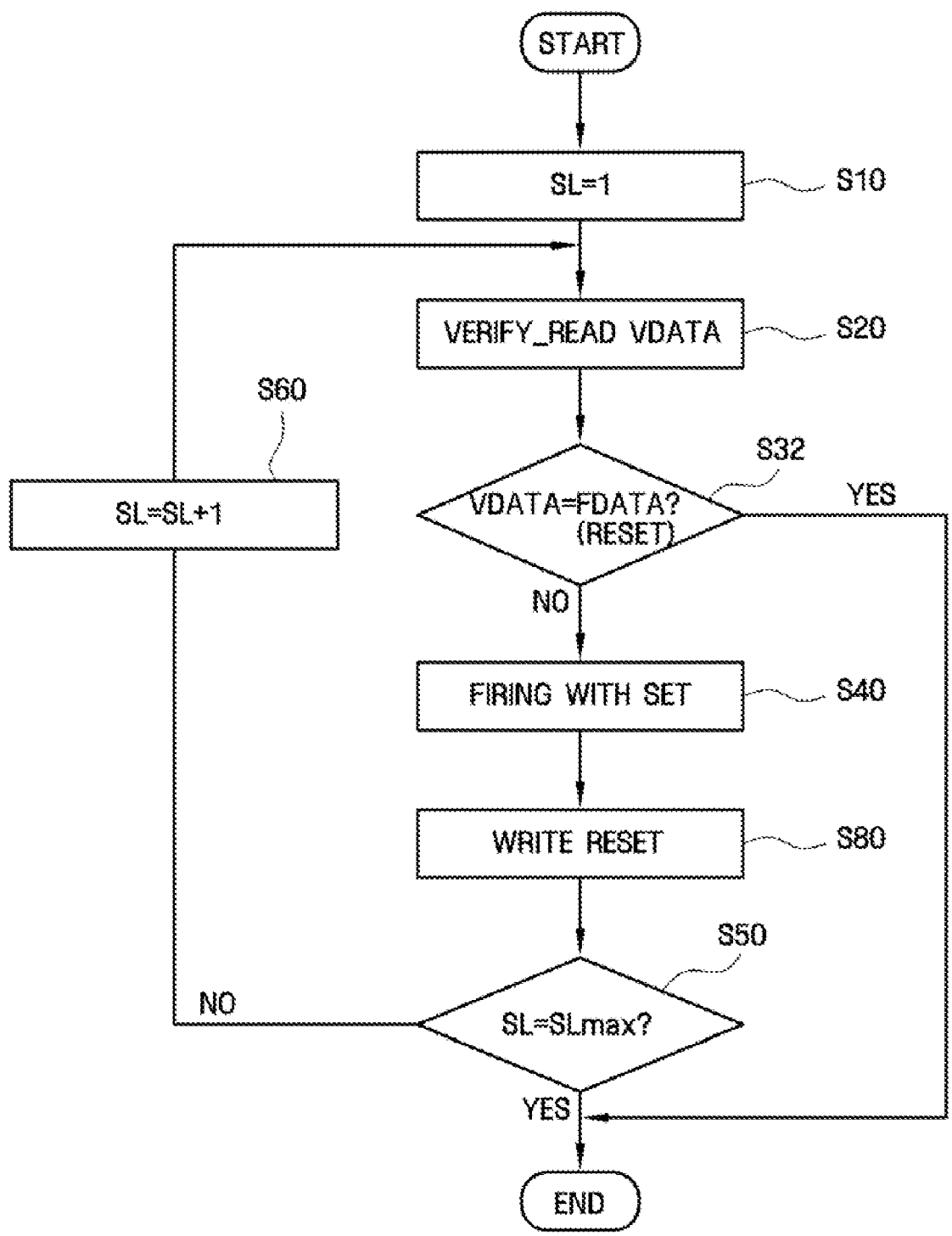
FIG. 8B is an exemplary flowchart for executing the timing chart of FIG. 8A.

FIG. 8A is a conceptual timing diagram illustrating a method of firing a PRAM according to still another embodiment of the invention. FIG. 8B is a flowchart related to the timing diagram of FIG. 8A.

Referring FIGS. 3A, 3B, 6A and 6B, the exemplary method summarized in FIGS. 8A and 8B differs from the foregoing in that following the firing with set (S40) a writing of reset data is made to the firing-failed phase change memory cells (S80).

Figure 9A:
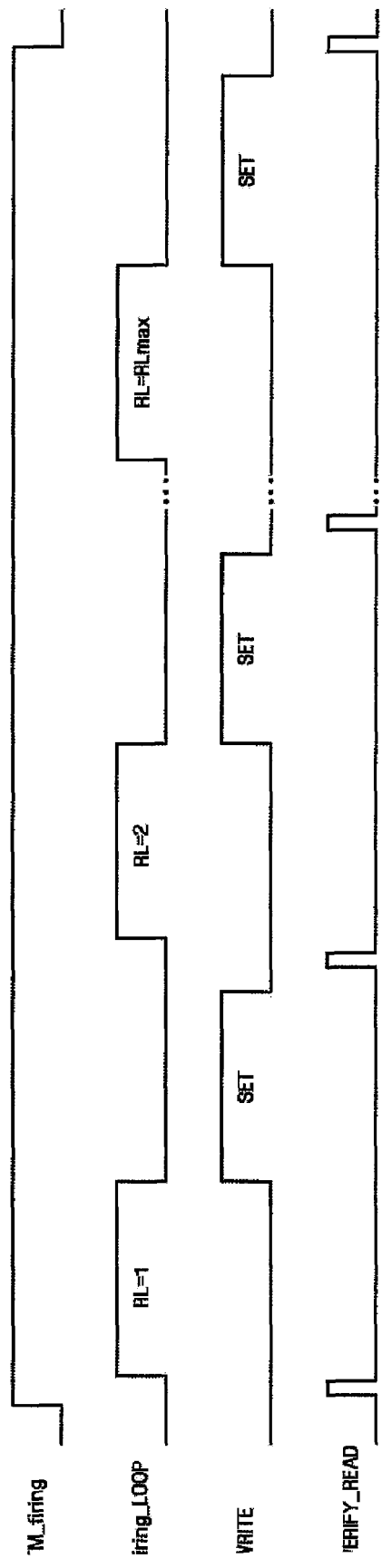
FIG. 9A is a conceptual timing chart illustrating a method of firing a PRAM according to still another embodiment of the invention.
Figure 9B:
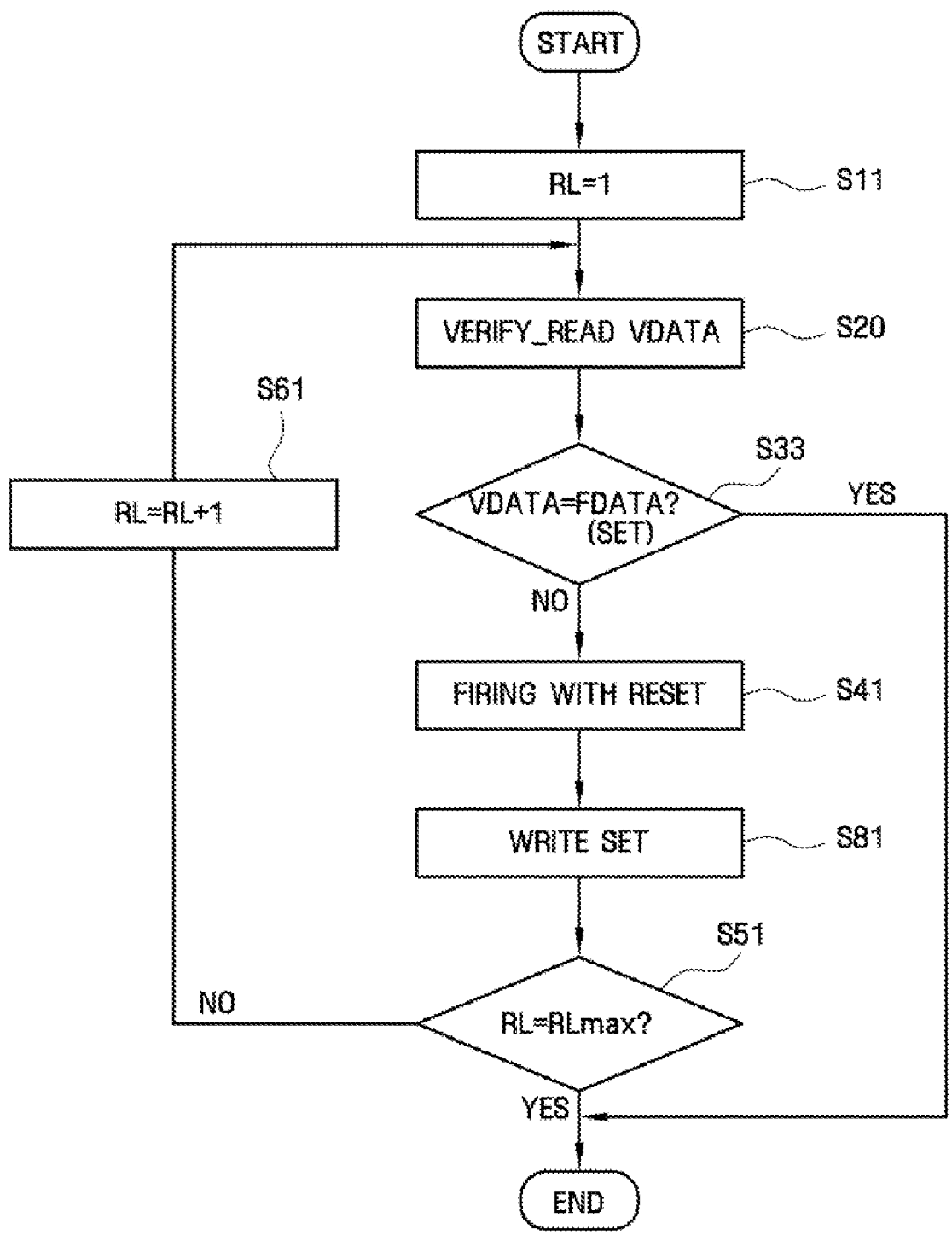
FIG. 9B is an exemplary flowchart for executing the timing chart of FIG. 9A.

FIG. 9A is a conceptual timing diagram illustrating a method of firing a PRAM according to still another embodiment of the invention. FIG. 9B is an exemplary flowchart related to the timing diagram of FIG. 9A.

Referring FIGS. 3A, 3B, 6A, 6B, 8A and 8B, the exemplary method summarized in FIGS. 9A and 9B differs from the foregoing in that following the firing with set (S40) a writing of set data is made to the firing-failed phase change memory cells (S81).

Figure 10:
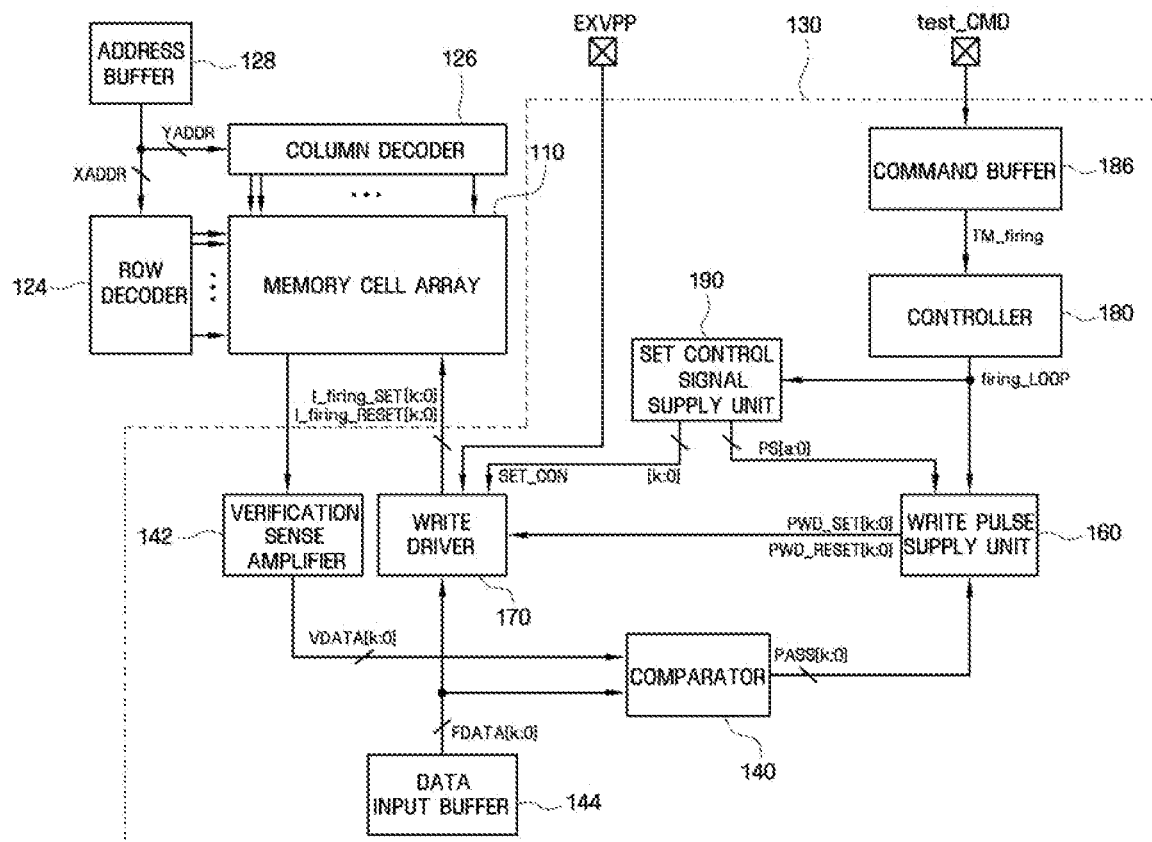
FIG. 10 is a block diagram illustrating a PRAM according to an embodiment of the invention.

FIG. 10 is a block diagram illustrating a PRAM according to an embodiment of the invention. Referring to FIG. 10, the PRAM includes a memory cell array 110, a row decoder 124, a column decoder 126, an address buffer 128, and a write circuit 130. The write circuit 130 includes a comparator 140, a verification sense amplifier 142, a data input buffer 144, a write pulse supply unit 160, a write driver 170, a controller 180, a command buffer 186, a set control signal supply unit 190, and the like. Hereinafter, the operation of the write circuit 130 performing the firing operation in test mode will be described.

The comparator 140 compares data verification data VDATA read from the plurality of phase change memory cells by the verification sense amplifier 142 with firing data FDATA input through the data input buffer 144. The comparison result PASS is applied to write pulse supply unit 160. Here, firing data is assumed to data having a set state. As indicated by the comparison signal PASS, it is further assumed that at least one firing-failed phase change memory cell is identified because its verification data VDATA and firing data FDATA are different.

The command buffer 186 receives an externally supplied test command test_CMD, and in response transitions the firing enable signal TM_firing to a logically high level. As the firing enable signal TM_firing goes high, the PRAM enters the test mode.

The controller 180 upon receiving the firing enable signal TM_firing, supplies a firing loop signal firing_LOOP indicating an N iteration (where N is a natural number) firing loop to be applied to a defined plurality of phase change memory cells, as controlled by write pulse supply unit 160 and set control signal supply unit 190. Though not shown, a write operation may be similarly controlled by supplying a write enable signal to the write pulse supply unit 160, set control signal supply unit 190, verification sense amplifier 142, write driver 170, etc.

The set control signal supply unit 190 receives the firing loop signal firing_LOOP, and supplies a set control signal SET_CON having a defined waveform, such as one of the waveforms shown for example in FIGS. 4 and 5A-5C. Further, the set control signal supply unit 190 may sequentially supply a plurality of non-overlapping control pulses PS. In one embodiment, the set control signal supply unit 190 may be configured as shown in FIG. 11.

The write pulse supply unit 160 receives the comparison signal PASS, the firing loop signal firing_LOOP, and the control pulse PS, and supplies a set pulse width control signal PWD_SET and a reset pulse width control signal PWD_RESET. Here, the set pulse width control signal PWD_SET becomes active in accordance with a first control pulse among a plurality of control pulses PS sequentially supplied, and becomes after the last control pulse PS.

Figure 13:
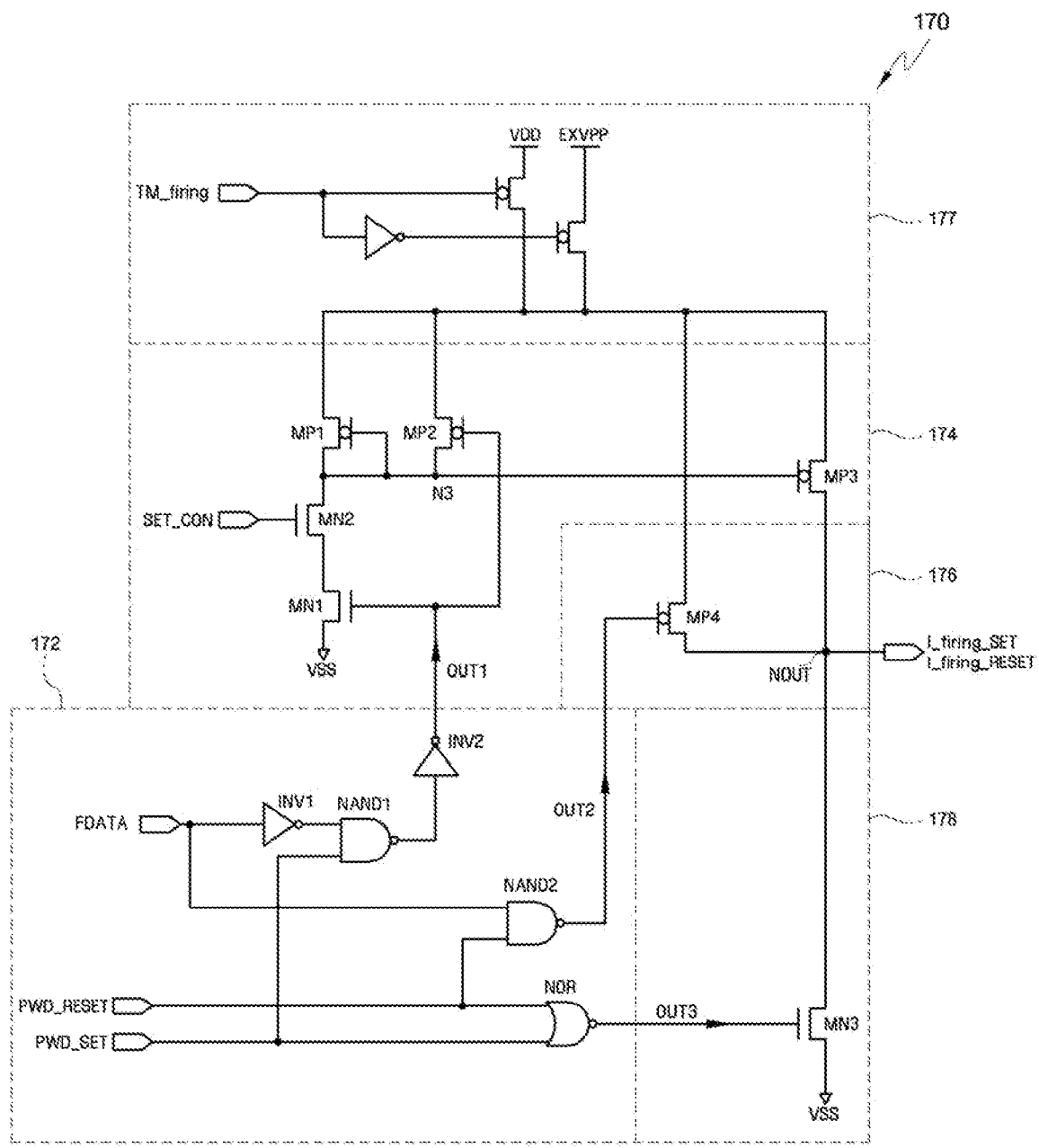
FIG. 13 is an exemplary circuit diagram of a write driver of FIG. 10.

The write driver 170 receives the firing data FDATA, the set control signal SET_CON, the set pulse width control signal PWD_SET, and the reset pulse width control signal PWD_RESET and externally provided second voltage EXVPP, and supplies the firing set pulse I_firing_SET or the firing reset pulse I_firing_RESET to at least one firing-failed phase change memory cell to write the firing data FDATA therein. Specifically, if the firing data FDATA is set data, the write driver 170 supplies the firing set pulse I_firing_SET including a sequence of sequentially descending impulses whose maximum current level varies for each firing loop, in response to the set control signal SET_CON while the set pulse width control signal PWD_SET is active. Further, if the firing data FDATA is reset data, the write driver 170 supplies the firing reset pulse I_firing_RESET while the reset pulse width control signal PWD_RESET is active. One exemplary circuit diagram for the write driver 170 is shown in FIG. 13.

Figure 11:
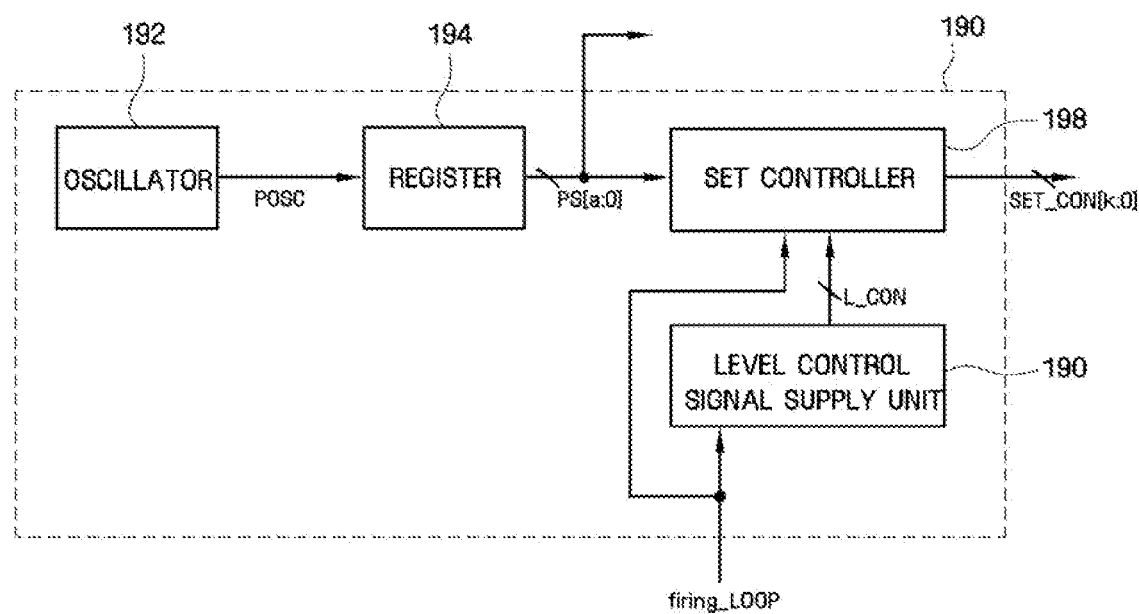
FIG. 11 is an exemplary block diagram of a set control signal supply unit of FIG. 10.

FIG. 11 is an exemplary block diagram of a set control signal supply unit of FIG. 10. Referring to FIG. 11, the set control signal supply unit 190 includes an oscillator 192, a register 194, a level control signal supply unit 196, and a set controller 198.

The oscillator 192 supplies a clock POSC, and the register 194 receives the clock POSC and sequentially supplies a plurality of control pulses PS having non-overlapping active periods.

The level control signal supply unit 196 receives a firing loop signal firing_LOOP indicating the N-th firing loop, and supplies a level control signal corresponding to the N-th firing loop. There are many methods for supplying the level control signal corresponding to the N-th firing loop. For example, a level control signal corresponding to each firing loop may be stored in a separate memory and output when the firing loop signal firing_LOOP representing the N-th firing loop is input. Further, a level control signal may be generated by decoding the firing loop signal firing_LOOP.

The set controller 198 sequentially receives a plurality of control pulses PS and supplies the set control signal SET_CON including a sequence of sequentially descending impulses defined in relation to a predetermined maximum level. In this case, however, the predetermined maximum level varies according to the level control signal L_CON.

An exemplary circuit diagram of the set controller 198 will be described in some additional detail with reference to FIG. 12.

Figure 12:
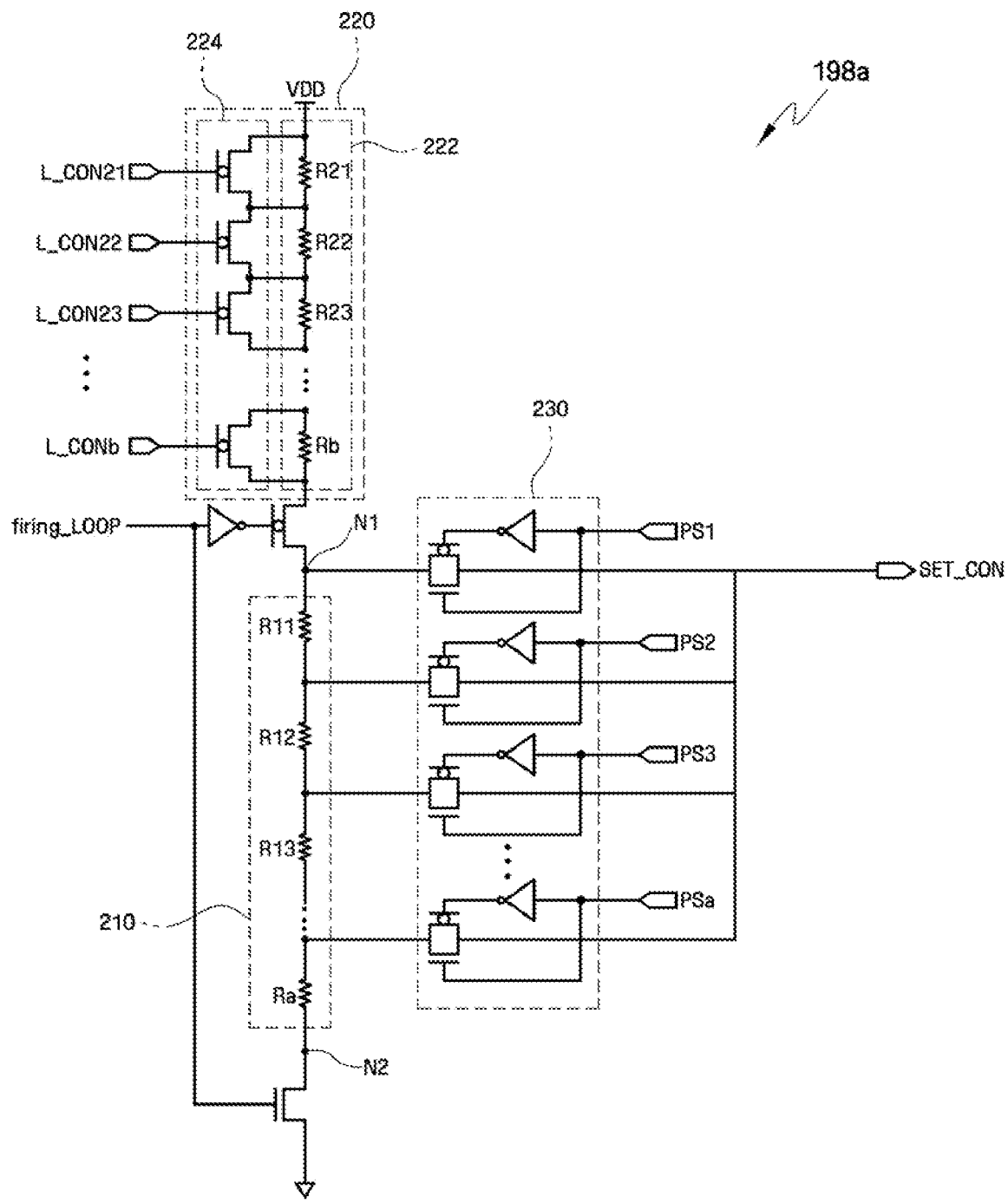
FIG. 12 is an exemplary circuit diagram of a set controller of FIG. 11.

FIG. 12 is an exemplary circuit diagram of a set controller 198a that generates the set control signal SET_CON to be used to generate the firing set pulse I_firing_SET of FIG. 4. The set controller 198a includes a first resistor array 210 having a plurality of resistors R11 to Ra connected in series between a first node N1 and a second node N2, a first voltage level regulating unit 220 that receives level control signals L_CON21 to L_CONb and regulates a voltage level of the first node N1, and a transmission unit 230 that sequentially receives a plurality of control pulses PS and sequentially outputs a node voltage between the first resistor array 210 and a plurality of resistors R11 to Ra.

Here, the first voltage level regulating unit 220 may include a second resistor array 222 including a plurality of resistors R21 to Rb connected in series between the first node N1 and a power supply voltage VDD, and a plurality of PMOS transistors 224 that are connected to respective nodes between the plurality of resistors R21 to Rb of the second resistor array 222 and are selectively turned on in response to the level control signals L_CON21 to L_CONb.

FIG. 13 is an exemplary circuit diagram of a write driver of FIG. 10. Referring to FIG. 13, the write driver 170 includes a write driver controller 172, a set pulse driver 174, a reset pulse driver 176, a switching unit 177, and a pull-down unit 178.

The write driver controller 172 receives the firing data FDATA, the set pulse width control signal PWD_SET, and the reset pulse width control signal PWD_RESET, and supplies first to third output signals OUT1, OUT2, and OUT3 for controlling the set pulse driver 174, the reset pulse driver 176, and the pull-down unit 178, respectively. The write driver controller 172 may include a plurality of inverters INV1 and INV2, a plurality of NAND gates NAND1 and NAND2, and a NOR gate NOR. The first output signal OUT1 is an inverted signal of a NAND operation signal of an inverted signal of the firing data FDATA and the set pulse width control signal PWD_SET. The second output signal OUT2 is a NAND operation signal of the firing data FDATA and the reset pulse width control signal PWD_RESET. The third output signal OUT3 is a NOR operation signal of the reset pulse width control signal PWD_RESET and the set pulse width control signal PWD_SET.

The set pulse driver 174 receives the set control signal SET_CON and the first output signal OUT1 and supplies the firing set pulse I_firing_SET. The set pulse driver 174 includes a plurality of NMOS transistors MN1 and MN2, and a plurality of PMOS transistors MP1, MP2, and MP3.

The reset pulse driver 176 receives the second output signal OUT2 and supplies a firing reset pulse I_firing_RESET. The reset pulse driver 176 includes a PMOS transistor MP4 that is turned on in response to the second output signal OUT2.

In the normal operation mode, the switching unit 177 supplies an internal elevated voltage VPP formed by internally elevating the power supply voltage to the set pulse driver 174 and the reset pulse driver 175 in response to the firing enable signal TM_firing. In the test mode, the switching unit 177 supplies the external elevated voltage EXVPP supplied from the outside to the set pulse driver 174 and the reset pulse driver 175. A voltage level of the external elevated voltage EXVPP supplied from the outside is higher than the internal elevated voltage VPP.

The pull-down unit 178 receives the third output signal OUT3 and pulls down the level of the output node NOUT. The pull-down unit 178 includes an NMOS transistor MN3 that is turned on in response to the third output signal OUT3. The current drive ability of the NMOS transistor MN3 is larger than the current drive ability of the PMOS transistors MP3 and MP4.

The operation of the write driver 170 when the firing data FDATA of the set state is supplied to the phase change memory cell in the test mode is as follows.

Since the firing data FDATA is in the low level, and the set pulse width control signal PWD_SET is in the high level, the NAND gate NAND1 outputs a signal of a low level. Then, the first output signal OUT1 becomes the high level through the inverter INV2. Accordingly, the NMOS transistor MN1 is turned on, and the PMOS transistor MP2 is turned off. Further, the NAND gate NAND2 outputs the second output signal OUT2 of the high level to turn off the PMOS transistor MP4, and the NOR gate NOR outputs the third output signal OUT3 of the low level to turn off the NMOS transistor MN3. In this state, if the set control signal SET_CON including a sequence of sequentially descending impulses defined in relation to a predetermined level, which varies for each firing loop, is input, a degree of turn-on of the NMOS transistor MN2 varies according to the voltage level of the set control signal SET_CON. Accordingly, the voltage of the node N3 varies, and a degree of turn-on of the PMOS transistor MP3 varies. However, since the set pulse driver 174 uses externally supplied external elevated voltage EXVPP in the test mode, the firing set pulse I_firing_SET that is higher than the current level of the set pulse to be supplied in the normal mode can be supplied.

Although the present invention has been described in connection with the exemplary embodiments, it will be apparent to those skilled in the art that various modifications and changes may be made thereto without departing from the scope of the invention. Therefore, it should be understood that the above embodiments are not limitative, but illustrative in all aspects.

According to the above-described PRAM, the phase change memory cells are not excessively fired, and the firing pulse having an appropriate level can be supplied to the memory cells. Further, since firing is performed using a write circuit, an additional circuit block dedicated to the performance of firing operations is not required.

What is claimed is:

1. A PRAM comprising:
   a memory cell array having a plurality of phase change memory cells; and
   a write circuit receiving an externally supplied first voltage and supplying a write pulse for writing data to the plurality of phase change memory cells in a normal mode, and receiving an externally provided second voltage higher than the first voltage and supplying a firing pulse for firing the plurality of phase change memory cells in a test mode.

2. The PRAM of claim 1, wherein the first voltage is a power supply voltage and the second voltage is an elevated voltage.

3. The PRAM of claim 1, wherein the firing pulse includes at least one of a firing reset pulse for firing the plurality of phase change memory cells to a reset state, and a firing set pulse for firing the plurality of phase change memory cells to a set state.

4. The PRAM of claim 1, wherein the write circuit supplies the firing pulse to at least one firing-failed phase change memory cell among the plurality of phase change memory cells during a firing verification operation performed during the test mode.

5. The PRAM of claim 4, wherein the write circuit comprises:
   a comparator comparing verification data read from the plurality of phase change memory cells and firing data associated with a firing operation for the plurality of phase change memory cells, and outputting a comparison signal identifying at least one firing-failed phase change memory cell having different verification data and firing data;
   a controller supplying a firing loop signal indicating one of a plurality of firing loops for firing the at least one firing-failed phase change memory cell;
   a write pulse generator receiving the comparison signal and the firing loop signal and supplying a set pulse width control signal and a reset pulse width control signal; and
   a write driver receiving the firing data, the set pulse width control signal, the reset pulse width control signal, and the second voltage, and supplying a firing set pulse or a firing reset pulse to the at least one firing-failed phase change memory cell in order to write the firing data.

6. The PRAM of claim 5, wherein the write circuit further comprises a set control signal supply unit receiving the firing loop signal, and supplying a set control signal including a sequence of sequentially descending impulses relative to a predetermined level, and the write driver receives the firing data, the set control signal, the set pulse width control signal, the reset pulse width control signal, and the second voltage, and supplies to the at least one firing-failed phase change memory cell, the firing set pulse including a sequence of sequentially descending impulses relative to a predetermined level or the firing reset pulse.

7. The PRAM of claim 6, wherein the write driver comprises:
a write driver controller receiving the firing data, the set pulse width control signal, and the reset pulse width control signal, and supplying first through third output signals;
a switching unit supplying, in response to a firing enable signal, an internal elevated voltage in the normal mode and an external elevated voltage in the test mode;
a set pulse driver receiving the set control signal and the first output signal, and supplying the firing set pulse to an output node using the internal elevated voltage in the normal mode and the external elevated voltage in the test mode;
a reset pulse driver receiving the second output signal, and supplying the firing reset pulse to the output node using the internal elevated voltage in the normal mode and the external elevated voltage in the test mode; and
a pull-down unit receiving the third output signal and pulling down the level of the output node.

8. The PRAM of claim 1, wherein, in the test mode, the write circuit supplies the firing pulse to the plurality of phase change memory cells without an additional firing verification operation.

9. The PRAM of claim 1, wherein the write circuit simultaneously supplies the write pulse to a N, where "N" is a natural number, phase change memory cells among the plurality of phase change memory cells in the normal mode, and simultaneously supplies the firing pulse to M, where "M" is a natural number, phase change memory cells among the plurality of phase change memory cells in the test mode, wherein M is greater than or equal to N.

10. The PRAM of claim 1, wherein the PRAM enters the test mode in response to an externally provided test command.

11. A method of firing a PRAM, the method comprising:
preparing a PRAM including a plurality of phase change memory cells, and a write circuit supplying a write pulse for writing data to the plurality of phase change memory cells in a normal mode and supplying a firing pulse associated with a firing operation to the plurality of phase change memory cells in a test mode;
causing the PRAM to enter the test mode; and
receiving an externally provided second voltage, higher than a first voltage applied during the normal mode, and supplying the firing pulse to the plurality of phase change memory cells.

12. The method of claim 11, wherein the supplying of the firing pulse comprises supplying the firing pulse to at least one firing-failed phase change memory cell among the plurality of phase change memory cells through a firing verification operation.

13. The method of claim 12, wherein the firing verification operation comprises:
performing a verifying read on data stored in the plurality of phase change memory cells;
determining whether the verified data stored in the plurality of phase change memory cells is in a specific state, and identifying at least one firing-failed phase change memory cells in accordance with this determination; and
supplying the firing pulse to the at least one firing-failed phase change memory cells to achieve a specific state.

14. The method of claim 13, wherein the specific state is a set state or a reset state.

15. The method of claim 13, wherein the performing a verifying read, determining whether the verified data stored in the plurality of phase change memory cells is in a specific state, and identifying at least one firing-failed phase change memory cells in accordance with this determination, and supplying the firing pulse to the at least one firing-failed phase change memory cells to achieve a specific state are repeated.

16. The method of claim 13, further comprising, before the performing a verifying read, writing data of the specific state to at least one of the plurality of phase change memory cells.

17. The method of claim 12, wherein the firing verification operation comprises:
performing a verifying read on data stored in the plurality of phase change memory cells;
determining whether the verified data is in a first state, and identifying at least one firing-failed phase change memory cells having verified data not in the first state;
supplying the firing pulse to fire the at least one firing-failed phase change memory cells to a second state different from the first state; and
writing data of the first state to the at lest one firing-failed phase change memory cells.

18. The method of claim 17, wherein the first state and the second state are a set state and a reset state or a reset state and a set state.

19. The method of claim 11, wherein, in the supplying of the firing pulse, the firing pulse is supplied to the plurality of phase change memory cells without an additional firing verification operation.

20. A method of firing a PRAM, the method comprising:
preparing a PRAM including a plurality of phase change memory cells;
performing a verifying read on data stored in the plurality of phase change memory cells;
determining whether the verified data is in a specific state, and identifying at least one firing-failed phase change memory cell having verified and read data not in the specific state; and
firing the at least one firing-failed phase change memory cell to the specific state.

21. The method of claim 20, wherein the firing comprises receiving an externally provided elevated voltage and supplying to the at least one firing-failed phase change memory cells a firing pulse capable of firing the at least one firing-failed phase change memory cells to the specific state.

22. The method of claim 20, wherein the specific state is a set state or a reset state.

23. The method of claim 20, wherein the performing a verifying read, the identifying the at least one firing-failed phase change memory cell, and the firing are repeated.

24. The method of claim 20, further comprising, before performing a verifying read, writing data of the specific state to the plurality of phase change memory cells.

* * * * *